US010310926B2

(12) United States Patent
Kelly et al.

(10) Patent No.: US 10,310,926 B2
(45) Date of Patent: Jun. 4, 2019

(54) DATA ERROR DETECTION IN COMPUTING SYSTEMS

(71) Applicant: Microsoft Technology Licensing, LLC, Redmond, WA (US)

(72) Inventors: Bryan Kelly, Carnation, WA (US); Mallik Bulusu, Bellevue, WA (US); Tom Nguyen, Auburn, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/028,707

(22) Filed: Jul. 6, 2018

(65) Prior Publication Data

US 2018/0314580 A1    Nov. 1, 2018

Related U.S. Application Data

(63) Continuation of application No. 15/247,756, filed on Aug. 25, 2016, now Pat. No. 10,025,649.

(51) Int. Cl.
| | |
|---|---|
| *G06F 11/07* | (2006.01) |
| *G06F 3/06* | (2006.01) |
| *G06F 11/10* | (2006.01) |
| *H03M 13/05* | (2006.01) |
| *H03M 13/29* | (2006.01) |

(52) U.S. Cl.
CPC ...... *G06F 11/0772* (2013.01); *G06F 11/1048* (2013.01); *G06F 11/1076* (2013.01); *H03M 13/05* (2013.01); *H03M 13/2906* (2013.01)

(58) Field of Classification Search
CPC ... G06F 11/0772; G06F 3/0619; G06F 3/0653
See application file for complete search history.

(56) References Cited

U.S. PATENT DOCUMENTS

| | | | | |
|---|---|---|---|---|
| 4,648,029 | A | * | 3/1987 | Cooper .................. G06F 13/34 710/113 |
| 6,934,903 | B1 | * | 8/2005 | Keltcher .............. G11C 7/1006 714/763 |
| 2013/0007507 | A1 | * | 1/2013 | Raj ..................... G06F 11/0715 714/5.11 |

* cited by examiner

*Primary Examiner* — Joseph D Torres
(74) *Attorney, Agent, or Firm* — Liang IP, PLLC

(57) ABSTRACT

Embodiments of ensuring data integrity in computing devices and associated methods of operations are disclosed therein. In one embodiment, a method includes receiving, at a memory controller, a data request from the persistent storage to copy data from the memory. In response to the received data request, the requested data is retrieved from the memory. The retrieved data contains data bits and corresponding error correcting bits. The method can also include determining, at the memory controller, whether the retrieved data bits contain one or more data integrity errors based on the error correcting bits associated with the data bits. In response to determining that the retrieved data bits contain one or more data integrity errors, the memory controller can write data representing existence of the one or more data integrity errors into a memory location accessible by the processor for ensuring data integrity.

20 Claims, 10 Drawing Sheets

DATA ERROR DETECTION IN COMPUTING SYSTEMS

CROSS-REFERENCE TO RELATED APPLICATION(S)

This application is a continuation of and claims priority to U.S. patent application Ser. No. 15/247,756, filed on Aug. 25, 2016.

BACKGROUND

Servers in cloud computing datacenters can utilize non-volatile dual in-line memory modules ("NVDIMMs") or other types of hybrid memory devices to achieve high application performance, data integrity, and rapid system recovery. Certain types of NVDIMMs (e.g., NVDIMM-Ns) can include a dynamic random access memory ("DRAM") module operatively coupled to a flash memory module. The DRAM module allows fast memory access while the flash memory module can persistently retain data upon unexpected power losses, system crashes, or normal system shutdowns.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Though NVDIMM-Ns can provide fast memory access and persistently retain data upon unexpected power loses, NVDIMM-Ns are typically a lot more expensive than regular DRAM modules. As such, software-based NVDIMMs ("NVDIMM-SWs") have been developed to emulate functions of the NVDIMM-Ns with independent volatile memory (e.g., a main memory) and non-volatile memory (e.g., a hard drive) in computing devices. During a power loss or a normal shutdown, a main processor can execute instructions to transfer or "flush" data in the volatile memory to the non-volatile memory via a peripheral component interconnect express ("PCIE") or other types of data bus by utilizing a battery or other backup power sources.

One challenge of implementing NVDIMM-SWs is to ensure data integrity when flushing data from the volatile memory to the non-volatile memory. Typically, data residing in DRAMs are stored using Hamming code or other suitable error detection code ("EDC") or error correcting code ("ECC"). The data residing in DRAMs are periodically checked for uncorrectable errors, and/or "scrubbed" for correctable errors. EDC or ECC bits can be stored in the DRAMs as extra bits with corresponding data bits. In one example, a single-error-correcting and dual-error-detecting ("SEC-DED") code can be implemented using 8 EDC/ECC bits for every 64 bits of data thus allowing both scrubbing for single flipped bits and detecting two-flipped bits. NVDIMM-Ns typically include an on-board memory controller that can persist not only the 64 bits of data but also the 8 EDC/ECC bits to a non-volatile memory during a flush operation.

In contrast, backup operations of NVDIMM-SWs rely on a main processor typically integrated with a system memory controller in a computing device. The system memory controller can retrieve both data bits (e.g., 64 bits of data) with associated error checking bits (e.g., 8 EDC/ECC bits) from DRAMs. The system memory controller, however, can only provide the retrieved data bits to the main processor executing an application or operating system for further processing. During normal operation, the system memory controller can inform the operating system of detected data errors triggering the main processor to perform certain corrective operations. For example, detected uncorrectable errors can trigger a computing device to enter a system management mode ("SMM") in x86 CPUs provided by Intel Corporation of Santa Clara, Calif. In SMM, all normal execution, including the operating system, is suspended, and the main processor can save all internal state to a special area of the main memory set aside for entry into SMM. Then, the main processor executes special software (usually stored in another special area in the main memory) with high privileges to handle the detected errors. Subsequently, the saved internal state can be restored to allow the main processor to continue normal operation.

In certain implementations, entry into SMM can be initiated by asserting a system management interrupt, or SMI# pin. The chipset then asserts a SMI active pin, SMIACT#, and saves all internal processor state to a special memory area reserved for SMM entry. When SMIACT# is asserted, a later asserted SMI# is ignored to prevent corrupting the internal state that was saved to the special memory area reserved for SMM entry. Because the SMI# assertion is ignored, the memory controller cannot enter another SMM when a memory error is detected or corrected when the system is already in SMM. As can be seen, this prevents an SMM handler from being aware of such detected/corrected memory errors. Certain implementations of NVDIMM-SWs rely on an SMM handler to transparently copy the volatile memory to non-volatile memory of NVDIMM-SWs. As such, when the stored data of the NVDIMM-SWs is restored from the non-volatile memory after a system reset, the operating system cannot determine whether the restored data contains any errors due to the backup and restore operations.

Several embodiments of the disclosed technology can address at least some aspects of the foregoing challenge by implementing a machine check register to store error checking data and scanning the machine check register with the main processor during backup operations of NVDIMM-SWs. In certain implementations, a machine check register can be implemented in a CPU cache as a set of model-specific registers. During a backup operation, the system memory controller can retrieve both data bits and corresponding error checking bits from DRAMs and perform error checking based on the error checking bits. The system memory controller can then write results of the error checking as error checking data to the machine check register. In other embodiments, the machine check register can be implemented as other suitable volatile or non-volatile component in the computing device.

The main processor can execute instructions that is a part of, for example, the basic input/output system ("BIOS") of the computing device to scan the error checking data continuously, periodically, or in other suitable manner. If the main processor detects that data integrity is compromised in the copied data bits, the main processor can insert an entry in a log file residing in the non-volatile memory. The log file can include one or more entries indicating a status of error checking related to the copied data bits. As such, upon a system reset, the operating system can check data integrity of any restored data bits from the non-volatile memory based on the entries in the log file. Thus, data integrity in NVDIMM-SWs can be ensured during flushing or backup operations.

DETAILED DESCRIPTION

Figure 1:
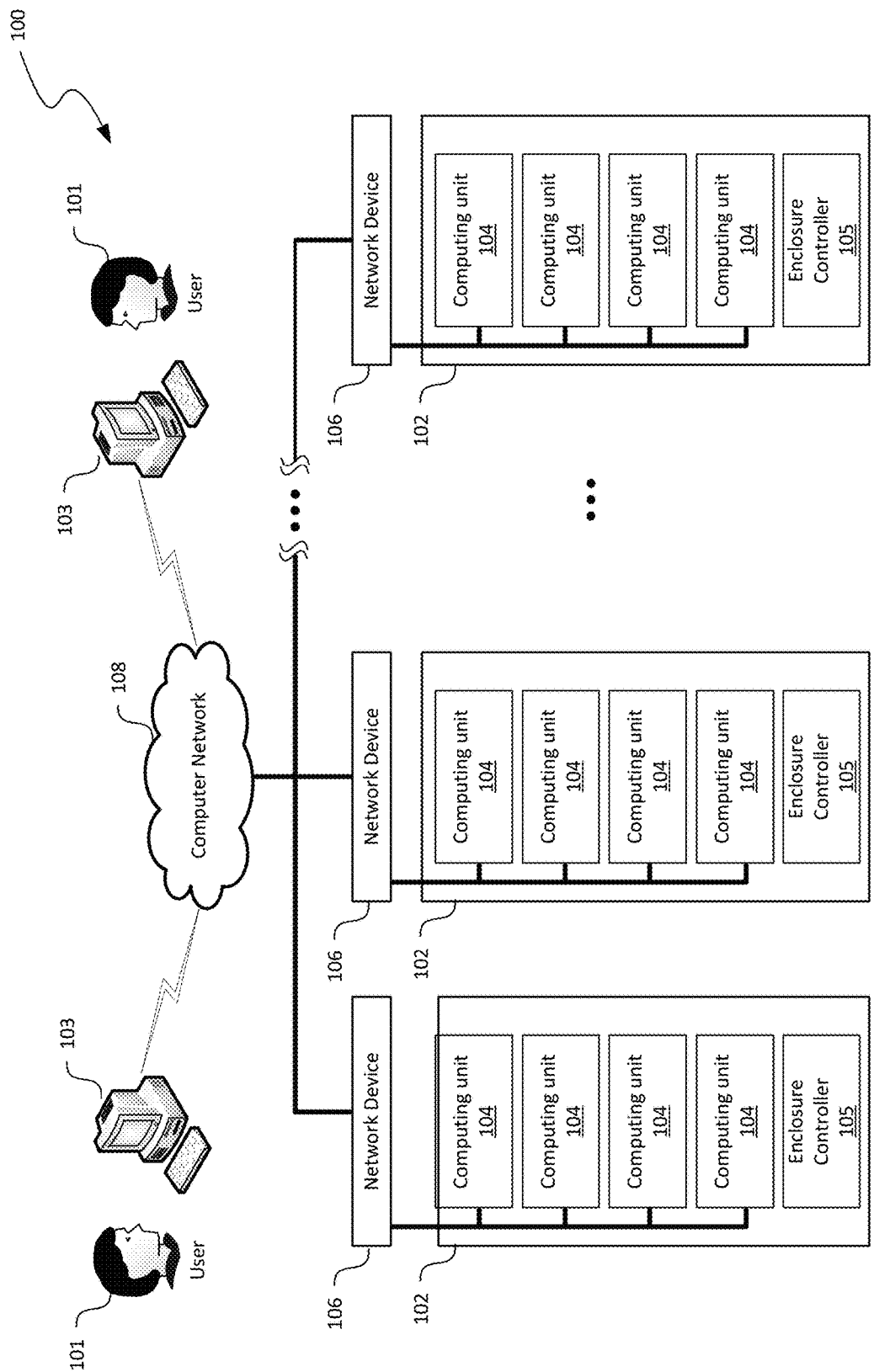
FIG. 1 is a schematic block diagram illustrating a computing system having computing units configured in accordance with embodiments of the present technology.

Various embodiments of computing systems, devices, components, modules, routines, and processes related to ensure data integrity in software implemented hybrid memory devices are described below. In the following description, example software codes, values, and other specific details are included to provide a thorough understanding of various embodiments of the present technology. A person skilled in the relevant art will also understand that the technology may have additional embodiments. The technology may also be practiced without several of the details of the embodiments described below with reference to FIGS. 1-7.

As used herein, the term "volatile memory" generally refers to a computer memory that requires power to maintain stored data. One example volatile memory is DRAM, which can retain stored data when powered via refreshing. When power is removed or interrupted, DRAM modules can lose stored data within minutes due to a lack of refreshing. In contrast, the term "non-volatile memory" generally refers to a computer memory that can retain stored data even without power. Examples of non-volatile memory include read-only memory ("ROM"), flash memory (e.g., NAND or NOR solid state drives or SSDs), and magnetic storage devices (e.g. hard disk drives or HDDs).

Also used herein, the term "hybrid memory device" generally refers to a computer memory device that includes one or more volatile memory modules and non-volatile memory modules operatively coupled to one another. In certain implementations, a hybrid memory device can be a single hardware module (e.g., NVDIMM-Ns) having a volatile memory, a non-volatile memory, and an on-board memory controller interconnected with one another. The hybrid memory device can have an external data bus and corresponding logic to be configured as a randomly addressable memory ("RAM") module. Example RAM modules include DIMMs (Dual Inline Memory Modules), JEDEC (Joint Electron Device Engineering Council) DDR SDRAM, and modules configured according to other suitable RAM specifications. The one or more non-volatile memory devices can be primarily or exclusively used to facilitate or ensure that certain data in the volatile memory modules appears to be persistent. As such, data in the volatile memory modules can be persisted when power is unexpectedly interrupted during operation or during normal shutdowns.

In other embodiments, a hybrid memory device can be software implemented in a computing device having a main processor, a main memory, and a persistent storage coupled to one another via a data bus on a motherboard. For example, certain memory blocks in a main memory can be designated as NVDIMM-SWs. During a power interruption or normal shutdown, data residing in the designated memory blocks can be persisted or flushed to the persistent storage using power from a battery, a capacitor, or other suitable backup power sources. Upon a system reset, the persisted data can then be restored into the designated memory blocks of the main memory.

Also used herein, the term "error correcting bit" or "error correcting bits" generally refers to one or more data bits indicating or otherwise useful to determine whether corresponding data bits include single flipped bit, two flipped bits, or other data errors compromising integrity of the data bits. Typically, data residing in DRAMs is periodically "scrubbed" for automatically correctable errors and checked for uncorrectable errors using Hamming code, other suitable error detection code ("EDC") or error correcting code ("ECC"), or codes that provide both error correcting for a first number of bits and error detection of a higher number of bits. Such error correcting bits can be stored in DRAMs with corresponding data bits. For example, 8 EDC/ECC bits can be stored in DRAMs to correspond to every 64 bits of data, which is known to provide single-bit error correcting and dual-bit error detection for the 64 bits of data. The term "error-protection block" refers to a unit of memory protected by a set of EDC/ECC bits. In the example above, 64 data bits can be protected with 8 EDC/ECC bits.

In certain computing systems such as network servers in datacenters, hybrid memory devices (e.g., NVDIMMs) are used for data storage due to a combination of fast data access time and fast system crash recovery. Due to capital and deployment cost reasons, NVDIMM-SWs are preferred over NVDIMM-Ns. However, under certain operating modes such as SMM, the NVDIMM-SWs can have difficulty ensuring data integrity during a backup operation. For example, when SMM is entered, existing system memory controllers typically only provide data bits without any EDC/ECC bits to be stored with the corresponding data bits during the backup operation. Furthermore, even if the memory controller asserts an SMI due to detected errors, the system cannot enter another SMM because the system is already in SMM with, for example, the SMIACT# output pin asserted. Thus, an SMM handler cannot detect any errors in the data read from the memory. As such, during a system reset, when the persisted data bits are restored, the operating system cannot determine whether the restored data contains any errors without the EDC/ECC bits.

Several embodiments of the disclosed technology can address at least some aspects of the foregoing challenge by implementing a machine check register to store error checking data and scanning the machine check register with the main processor during backup operations of NVDIMM-SWs. In certain embodiments, a machine check register can be implemented in a CPU cache (e.g., L1, L2, or L3 cache) as a set of model-specific registers. During operation, the memory controller can retrieve all data bits and error correcting bits from DRAMs and perform error checking based on the included error correcting bits. The system memory controller can then write results as error checking data to the machine check register (or other predetermined memory location designated for this purpose) while sending the data bits of the retrieved data to be persisted in the non-volatile memory. For example, the results can include one or more of the following: an incremented count of auto-corrected errors, an incremented count of detected uncorrectable errors, a memory address at which an error is detected, an associated error type, a single bit indicating at least one error occurred, or other suitable information.

The main processor can execute instructions as a part of, for example, the BIOS of the computing device to scan the machine check register periodically or in other suitable manners. In one example, the main processor can be configured to scan the error checking data after every K*N data bits are copied from the volatile memory to the non-volatile memory, where N is a number of data bits in an error-protection block (e.g., 64 data bits in the example above), and K is greater than or equal to two. Depending on the information stored in the error checking data, if one or more errors are detected and a more specific location of the one or more errors is desired, one or more portions of the data bits read may be re-read. In certain implementations, such as where a specific address of the error is not known, a binary search of the K error-protection blocks may be used to efficiently narrow the location of the error. In other implementations, such as where an address of a last error is known, only error-protection blocks prior to the one reported as erroneous can be re-read. In further implementations, scanning the error checking data can be performed after re-reading each error-protection block to determine which error protection block has at least one error. The foregoing operations can provide flexibility between granular detection of address ranges in which errors can occur and sizes of data for error checking.

If the main processor detects that data integrity is compromised for certain data blocks (e.g., having two flipped bits) based on the error checking data, the main processor can generate an entry in a log file stored in the non-volatile memory indicating data corruption. As such, upon a system reset, the operating system can check for data integrity of any restored data from the non-volatile memory based on the entries in the log file. Thus, data integrity of persisted data can be ensured. Additional examples and embodiments of the disclosed technology are described in more detail below with reference to FIGS. 1-5.

FIG. 1 is a schematic block diagram illustrating a computing system 100 having computing units 104 configured in accordance with embodiments of the present technology. As shown in FIG. 1, the computing system 100 can include multiple computer enclosures 102 individually housing computing units 104 interconnected by a computer network 108 via network devices 106. The computer network 108 can also be configured to interconnect the individual computing units 104 with one or more client devices 103. Even though particular configurations of the computing system 100 are shown in FIG. 1, in other embodiments, the computing system 100 can also include additional and/or different components than those shown in FIG. 1.

The computer enclosures 102 can include structures with suitable shapes and sizes to house the computing units 104. For example, the computer enclosures 102 can include racks, drawers, containers, cabinets, and/or other suitable assemblies. In the illustrated embodiment of FIG. 1, four computing units 104 are shown in each computer enclosure 102 for illustration purposes. In other embodiments, individual computer enclosures 102 can also include ten, twenty, or any other suitable number of computing units 104. In further embodiments, the individual computer enclosures 102 can also include power distribution units, fans, intercoolers, and/or other suitable electrical and/or mechanical components (not shown).

The computing units 104 can individually include one or more servers, network storage devices, network communications devices, or other suitable computing devices suitable for datacenters or other computing facilities. In certain embodiments, the computing units 104 can be configured to implement one or more cloud computing applications and/or services accessible by user 101 using the client device 103 (e.g., a desktop computer, a smartphone, etc.) via the computer network 108. The computing units 104 can individually include one or more software implemented hybrid memory devices 120 (shown in FIGS. 2A-2E) and can be configured to ensure data integrity in accordance with embodiments of the disclosed technology, as described in more detail below with reference to FIGS. 2A-2E.

As shown in FIG. 1, the individual computer enclosures 102 can also include an enclosure controller 105 configured to monitor and/or control a device operation of the computing units 104, power distribution units, fans, intercoolers, and/or other suitable electrical and/or mechanical components. For example, the enclosure controllers 105 can power up, power down, reset, power cycle, refresh, and/or perform other suitable device operations on a particular computing unit 104 in a computer enclosure 102. In certain embodiments, the individual enclosure controllers 105 can include a rack controller configured to monitor operational status of the computing units 104 housed in a rack. One suitable rack controller is the Smart Rack Controller (EMX) provided by Raritan of Somerset, N.J. In other embodiments, the individual enclosure controllers 105 can include a cabinet controller, a container controller, or other suitable types of controller.

In the illustrated embodiment, the enclosure controllers 105 individually include a standalone server or other suitable types of computing device located in a corresponding computer enclosure 102. In other embodiments, the enclosure controllers 105 can include a service of an operating system or application running on one or more of the computing units 104 in the individual computer enclosures 102. In further embodiments, the in the individual computer enclosures 102 can also include remote server coupled to the computing units 104 via an external network (not shown) and/or the computer network 108.

In certain embodiments, the computer network 108 can include twisted pair, coaxial, untwisted pair, optic fiber, and/or other suitable hardwire communication media, routers, switches, and/or other suitable network devices. In other embodiments, the computer network 108 can also include a wireless communication medium. In further embodiments, the computer network 108 can include a combination of hardwire and wireless communication media. The computer network 108 can operate according to Ethernet, token ring, asynchronous transfer mode, and/or other suitable link layer protocols. In the illustrated embodiment, the computing units 104 in the individual computer enclosure 102 are coupled to the computer network 108 via the network devices 106 (e.g., a top-of-rack switch) individually associated with one of the computer enclosures 102. In other embodiments, the computer network 108 may include other suitable topologies, devices, components, and/or arrangements.

In operation, the computing units 104 can receive requests from the users 101 using the client device 103 via the computer network 108. For example, the user 101 can request a web search using the client device 103. After receiving the request, one or more of the computing units 104 can perform the requested web search and generate relevant search results. The computing units 104 can then transmit the generated search results as network data to the client devices 103 via the computer network 108 and/or other external networks (e.g., the Internet, not shown). As described in more detail below with reference to FIGS. 2A-2E, the individual computing units 104 can include one or more software implemented hybrid memory devices 120, and can ensure data integrity in accordance with embodiments of the disclosed technology.

FIGS. 2A-2E are schematic block diagrams of a computing unit 104 suitable for the computing system 100 in FIG. 1 and at various operational stages in accordance with embodiments of the disclosed technology. In particular, FIGS. 2A-2E illustrate various operational stage of the computing unit 104 performing backup or flushing of data in an NVDIMM-SW during a power failure or a normal shutdown. In certain embodiments, the various operational stages can be performed while an operating system of the computing unit 104 is suspended, for example, when an SMM is triggered. In other embodiments, the various operational stages can be performed when the operating system is available on the computing unit 104. Details of the various operational stages are described below in turn.

Figure 2A:
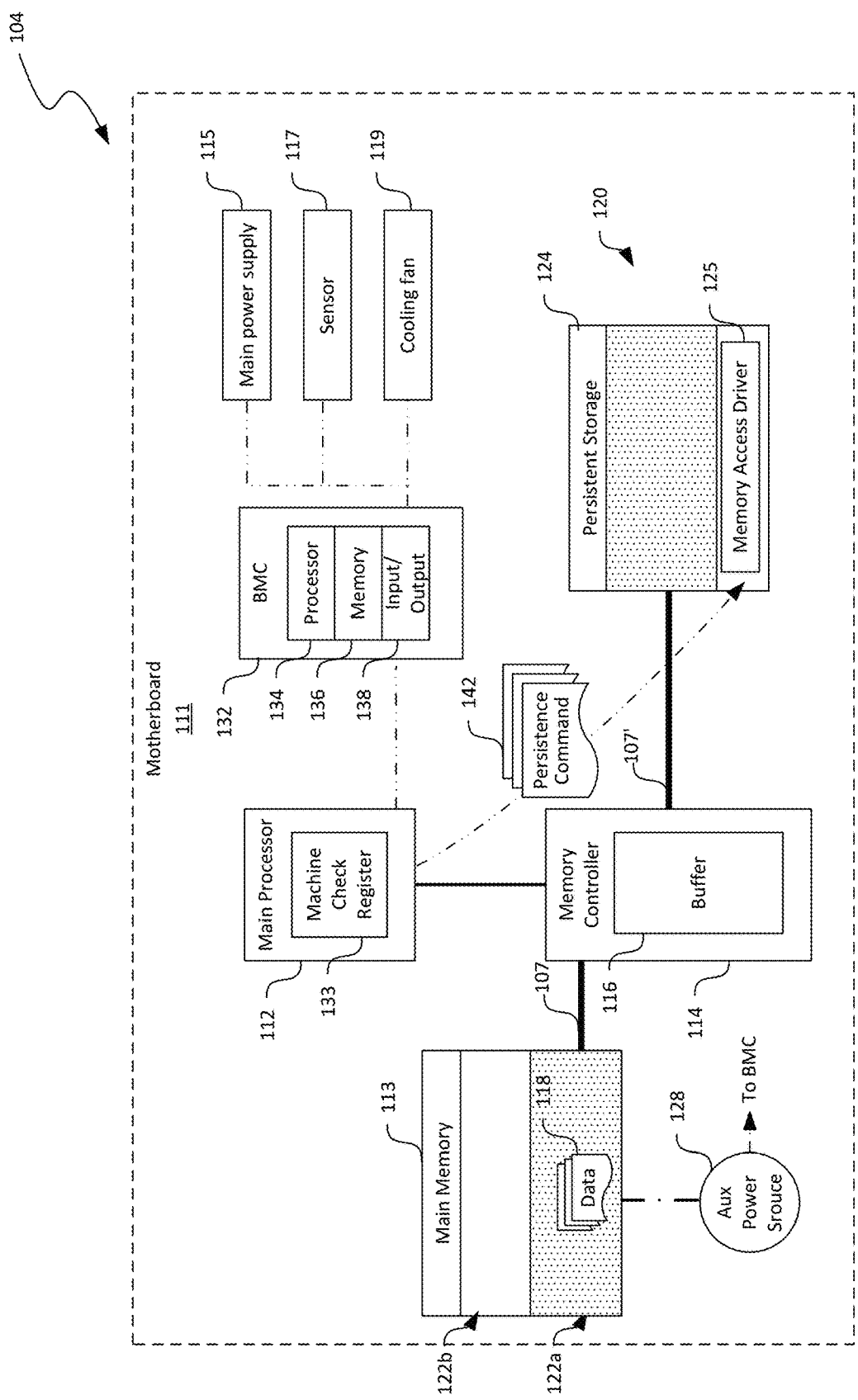
FIGS. 2A-2E are schematic block diagrams of a computing unit suitable for the computing system of FIG. 1 at various operational stages in accordance with embodiments of the present technology.

As shown in FIG. 2A, the computing unit 104 can include a motherboard 111 carrying a main processor 112, a main memory 113, a memory controller 114, a persistent storage 124, an auxiliary power source 128, and a baseboard management controller ("BMC") 132 operatively coupled to one another. The motherboard 111 can also carry a main power supply 115, a sensor 117 (e.g., a temperature or humidity sensor), and a cooling fan 119 (collectively referred to as "peripheral devices") coupled to the BMC 132. Though FIGS. 2A-2E only show the motherboard 111 in phantom lines, the motherboard 111 can include a printed circuit board with one or more sockets configured to receive the foregoing or other suitable components described herein. In other embodiments, the motherboard 111 can also carry indicators (e.g., light emitting diodes), communication components (e.g., a network interface module), platform controller hubs, complex programmable logic devices, and/or other suitable mechanical and/or electric components in lieu of or in addition to the components shown in FIGS. 2A-2E.

In further embodiments, the motherboard 111 can be configured as a computer assembly or subassembly having only portions of those components shown in FIGS. 2A-2E. For example, the motherboard 111 can form a computer assembly containing only the main processor 112, main memory 113, and the BMC 132 without the persistent storage 124 being received in a corresponding socket. In other embodiments, the motherboard 111 can also be configured as another computer assembly with only the BMC 132. In further embodiments, the motherboard 111 can be configured as other suitable types of computer assembly with suitable components.

The main processor 112 can be configured to execute instructions of one or more computer programs by performing arithmetic, logical, control, and/or input/output operations, for example, in response to a user request received from the client device 103 (FIG. 1). The main processor 112 can include one or more microprocessors, field-programmable gate arrays, and/or other suitable logic devices. Even though only one main processor 112 is shown in FIG. 2A, in other embodiments, the computing unit 104 can include two, three, or any suitable number of main processors or "cores" (not shown) operating in parallel, serial, or in other suitable fashions. Each core can include core components of the main processor 112 involved in executing instructions, including, inter alia, arithmetic logic unit, floating-point unit, L1 and L2 cache. In further embodiments, the main processor 112 can also include one or more system agents configured to facilitate operations of the cores. The system agents can include, inter alia, QuickPath® Interconnect controllers, L3 cache, snoop agent pipeline, etc.

The main memory 113 can include a digital storage circuit directly accessible by the main processor 112 via, for example, a data bus 107. In one embodiment, the data bus 107 can include an inter-integrated circuit bus or I²C bus as detailed by NXP Semiconductors N.V. of Eindhoven, the Netherlands. In other embodiments, the data bus 107 can also include a PCIE bus, system management bus, RS-232, small computer system interface bus, or other suitable types of control and/or communications bus. In certain embodiments, the main memory 113 can include one or more DRAM modules. In other embodiments, the main memory 113 can also include magnetic core memory or other suitable types of memory.

The persistent storage 124 can include one or more non-volatile memory devices operatively coupled to the memory controller 114 via another data bus 107' (e.g., a PCIE bus). For example, the persistent storage 124 can include an SSD, HDD, or other suitable storage components. As shown in FIG. 2A, the persistent storage 124 can also include a memory access driver 125 configured to facilitate access to the main memory 113 independent of the main processor 112. In certain embodiments, the memory access driver 125 can facilitate copying of data 118 from the main memory 113 to the persistent storage 124 while the main processor 112 performs other operations during data transfer. One example implementation suitable for the memory access driver 125 is the I/O Acceleration Technology, which is an embedded direct memory access ("DMA") controller provided by Intel Corporation of Santa Clara, Calif.

As shown in FIG. 2A, the computing unit 104 can implement a software based NVDIMM using at least a portion of the main memory 113 and the persistent storage 124. For example, in certain embodiments, a first portion 122a of the main memory 113 can be designated as a volatile memory of an NVDIMM-SW 120 (shown as shaded areas for clarity in FIG. 2A) such that any data 118 residing in first portion 122a of the main memory 113 can be automatically backed up and persisted in the persistent storage 124 during a power failure, normal shutdown, an entry into SMM, or under other suitable conditions. A second portion 122b of the main memory 113 can be designated, for example, by default to be a volatile memory such that any data (not shown) in the second portion 122b is lost during a power failure or normal shutdown. In other embodiments, the entire main memory 113 can be designated as a volatile memory of an NVDIMM-SW. Even though the main memory 113 and the persistent storage 124 are shown as separate components in FIG. 2A, in further embodiments, the main memory 113 and the persistent storage 124 can be integrated into a single hardware package, or can have other suitable configurations.

As shown in FIG. 2A, the main processor 112 can be coupled to the memory controller 114 having a buffer 116. The memory controller 114 can include a digital circuit that is configured to monitor and manage operations of the main memory 113 and the persistent storage 124. For example, in one embodiment, the memory controller 114 can be configured to periodically refresh the main memory 113. In another example, the memory controller 114 can also continuously, periodically, or in other suitable manners transmit or "write" data 118b (shown in FIG. 2C) in the buffer 116 to the main memory 113 and/or the persistent storage 124. In the illustrated embodiment, the memory controller 114 is independent from the main processor 112. In other embodiments, the memory controller 114 can be integrated into a package containing the main processor 112, for example, as a system agent of the main processor 112. One example memory controller is the Intel® 5100 memory controller provided by the Intel Corporation of Santa Clara, Calif.

The BMC 132 can be configured to monitor operating conditions and control device operations of various components on the motherboard 111. As shown in FIG. 2A, the BMC 132 can include a processor 134, a memory 136, and an input/output component 138 operatively coupled to one another. The processor 134 can include one or more microprocessors, field-programmable gate arrays, and/or other suitable logic devices. The memory 136 can include volatile and/or nonvolatile computer readable media (e.g., ROM, RAM, magnetic disk storage media, optical storage media, flash memory devices, EEPROM, and/or other suitable non-transitory storage media) configured to store data received from, as well as instructions for, the processor 136. In one embodiment, both the data and instructions are stored in one computer readable medium. In other embodiments, the data may be stored in one medium (e.g., RAM), and the instructions may be stored in a different medium (e.g., EEPROM). The input/output component 124 can include a digital and/or analog input/output interface configured to accept input from and/or provide output to other components of the BMC 132. One example BMC is the Pilot 3 controller provided by Avago Technologies of Irvine, Calif.

The auxiliary power source 128 can be configured to controllably provide an alternative power source (e.g., 12-volt DC) to the NVDIMM-SW 120, the main processor 112, the memory controller 114, and other components of the computing unit 104 in lieu of the main power supply 115. In the illustrated embodiment, the auxiliary power source 128 includes a power supply that is separate from the main power supply 115. In other embodiments, the auxiliary power source 128 can also be an integral part of the main power supply 115. In further embodiments, the auxiliary power source 128 can include a capacitor sized to contain sufficient power to write all data from the portion 122 of the main memory 113 to the persistent storage 124. As shown in FIG. 2A, the BMC 132 can monitor and control operations of the auxiliary power source 128, as described in more detail below.

The peripheral devices can provide input to as well as receive instructions from the BMC 132 via the input/output component 138. For example, the main power supply 115 can provide power status, running time, wattage, and/or other suitable information to the BMC 132. In response, the BMC 132 can provide instructions to the main power supply 115 to power up, power down, reset, power cycle, refresh, and/or other suitable power operations. In another example, the cooling fan 119 can provide fan status to the BMC 132 and accept instructions to start, stop, speed up, slow down, and/or other suitable fan operations based on, for example, a temperature reading from the sensor 117. In further embodiments, the motherboard 111 may include additional and/or different peripheral devices.

As shown in FIG. 2A, the main processor 112 can also include a machine check register 133 configured to store data representing integrity of any copied data from the main memory 113 to the persistent storage 124. In certain implementations, the machine check register 133 can be implemented in a L1, L2, and/or L3 CPU cache as a set of model-specific registers. During operation, the memory controller 114 can retrieve all bits of data from DRAMs and perform error checking based on any included EDC/ECC bits. The memory controller 114 can then write results as error checking data 123 (shown in FIG. 2D) to the machine check register 133 before providing only the data bits to the persistent storage 124, as described in more detail below with reference to FIGS. 2B-2E. In other embodiments, the machine check register 133 can also be implemented as other suitable types of volatile or non-volatile component.

FIG. 2A shows an operating stage in which the main processor 112 has detected a power failure of the main power supply 115, a shutdown request from a user 101 (FIG. 1), or other conditions causing data backup in the NVDIMM-SW 120. In response to the detected condition(s), the main processor 112 can instruct the NVDIMM-SW 120 to persist any data 118 in the first portion 122a of the main memory 113. For example, as shown in FIG. 2A, the main processor 112 can issue a persistence command 142 to the memory access driver 125 in the persistence storage 124. The persistence command 142 can instruct the memory access driver 125 to copy the data 118 from the main memory 113 to the persistent storage 124. In other embodiments, the main processor 112 can directly facilitate copying of the data 118 from the main memory 113 to the persistent storage 124 without utilizing the memory access driver 125.

Figure 2B:
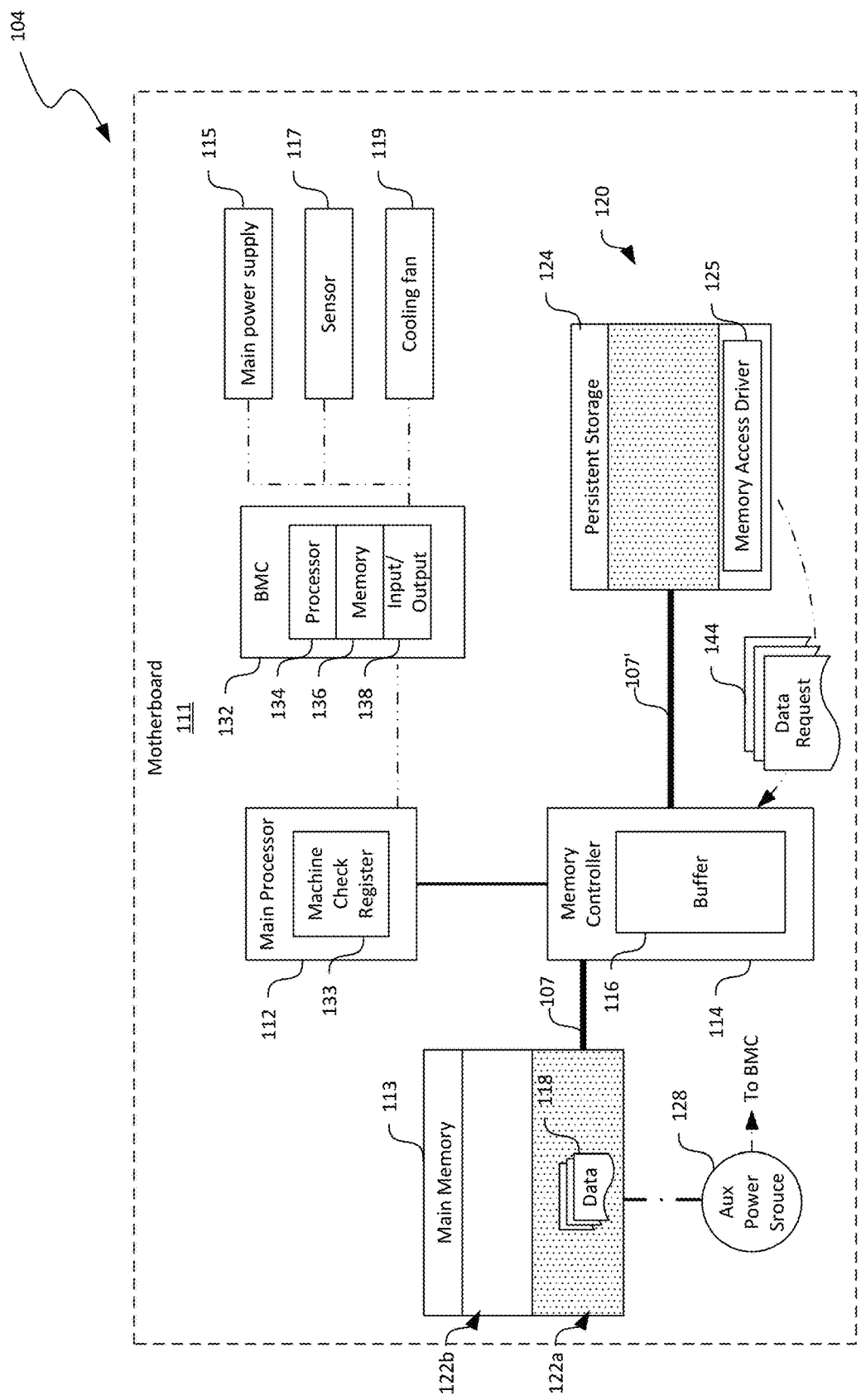
Figure 2C:
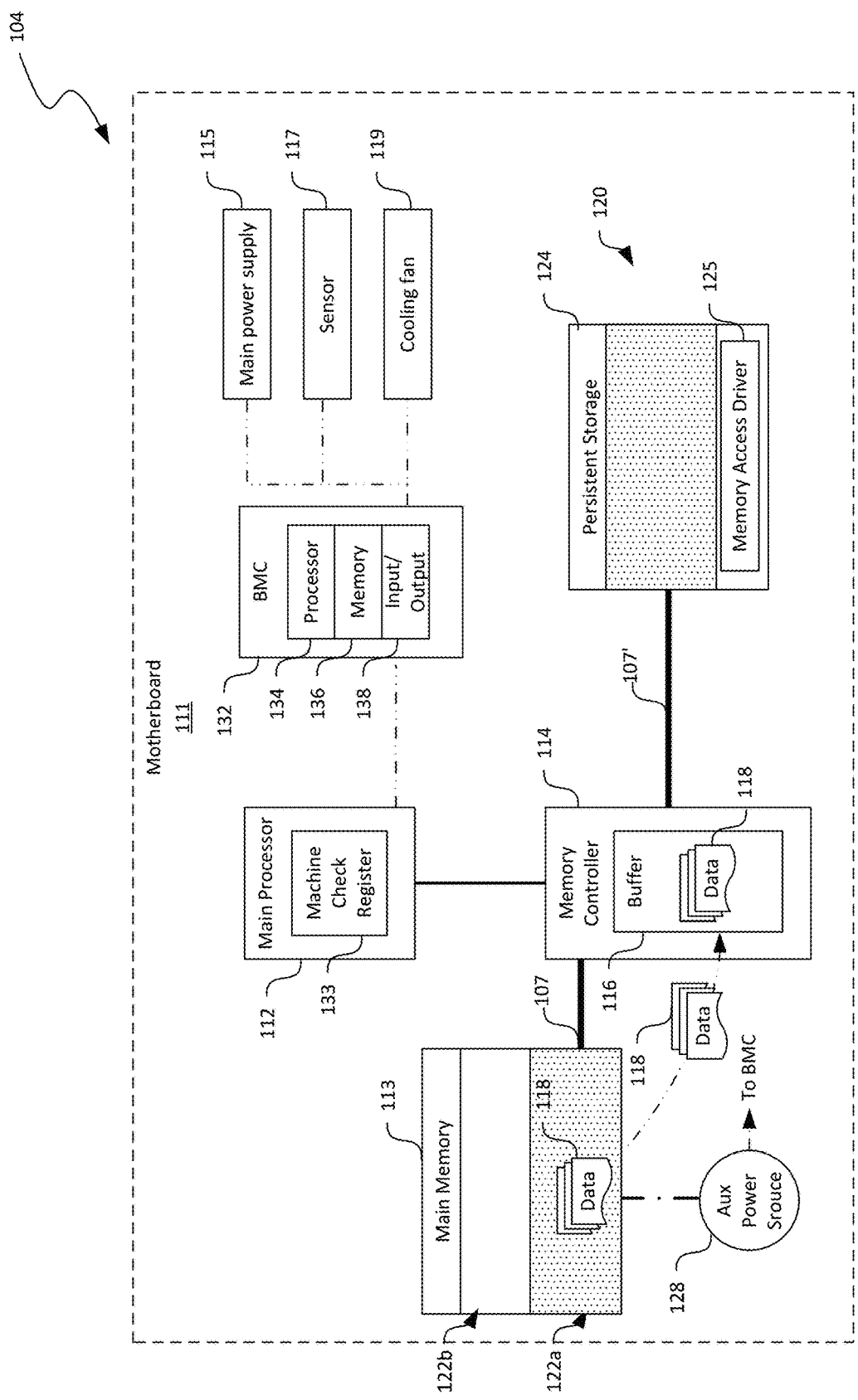

As shown in FIG. 2B, the memory access driver 125 can transmit a data request 144 to the memory controller 114 for accessing the first portion 122a of the main memory 113 via the data bus 107. In response, the memory controller 114 can retrieve the data 118 from the first portion 122a of the main memory 113. In certain embodiments, the data 118 can include certain number of data bits with associated EDC/ECC bits. For example, the data 118 can include 64 data bits with 8 EDC/ECC bits. In other embodiments, the data 118 received at the memory controller 114 can include other suitable number of data bits and/or EDC/ECC bits. Upon receiving the data 118 from the main memory 113, the memory controller 114 can store the data 118 in the buffer 116, as shown in FIG. 2C.

Figure 2D:
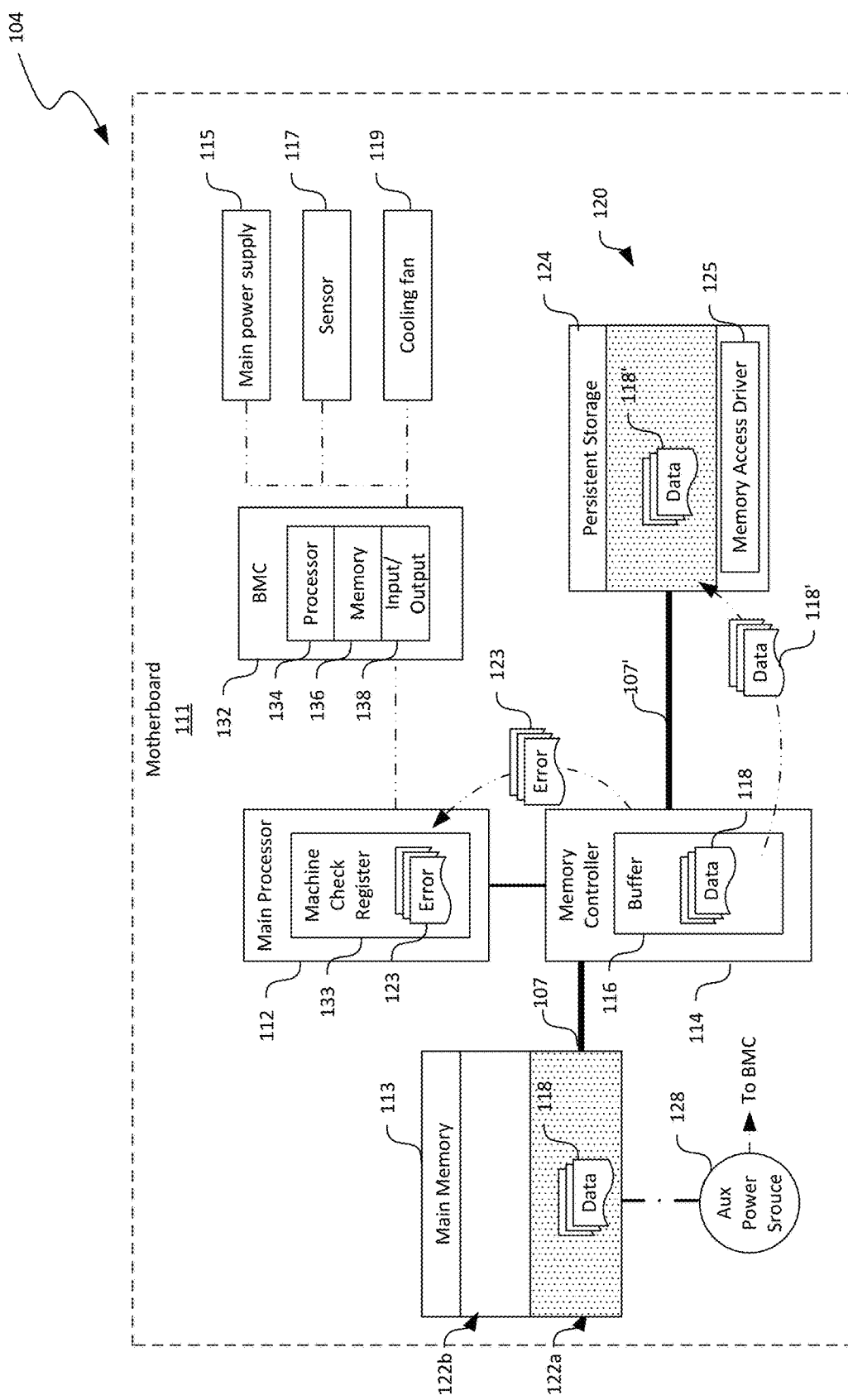

The memory controller 114 can be configured to check data integrity of the received data 118 based on the EDC/ECC bits. As shown in FIG. 2D, in response to determining that an integrity error is detected, in normal operation, the memory controller 114 can trigger an SMM handler function to be executed by the main processor 112, such as by triggering a System Management Interrupt ("SMI"). The SMM handler function may then perform suitable corrective operations to address such integrity errors. However, under certain circumstances, for example, when the computing unit 104 is already in SMM, the ability to trigger an SMM handler function is disabled. As such, no corrective operations can be performed.

To address such a challenge, in accordance with several embodiments of the disclosed technology, the memory controller 114 can be configured to write error checking data 123 into the machine check register 133 of the main processor 112 in response to a detected integrity error. In certain embodiments, the memory controller 114 can also write other error checking data 123 related to one or more errors related to transmission on the data bus 107' into the machine check register 133. In other embodiments, the memory controller 114 can write error checking data 123 related to other suitable types of data integrity errors corresponding to transmission of the data 118. The memory controller 114 can then provide data 118' with only the data bits (e.g., 64 data bits) to a storage location setup, prepared, initiated, or predetermined by the memory access driver 125 via the data bus 107'.

In accordance with embodiments of the disclosed technology, the main processor 112 can be configured to execute instructions to scan the machine check register 133 periodically or in other suitable manners. In certain embodiments, the executed instructions can be a part of BIOS or an independent piece of firmware on the motherboard 111. In other embodiments, the executed instructions can be a part of an operating system or other components of the computing unit 104. In further embodiments, the executed instructions can be an application, a driver, or other suitable types of software component independent of the operating system. In one operating mode, the main processor 112 can scan the machine check register 133 in an asynchronous fashion with respect to copying the data 118 from the main memory 122 to the persistent storage 124. In other embodiments, the main processor 112 can scan the machine check register 133 in a synchronous or other suitable fashions.

In certain embodiments, the error checking data 123 can include various types of data indicating the existence of data integrity errors. In one example, the error checking data 123 can include an identification of a block of data and a binary signal indicating the existence of an error. In another example, the error checking data 123 can include an incremented count of errors. In response, the main processor 112 can detect a new error by, for instance, compare the incremented count of errors with a previous value. In further examples, the error checking data 123 can include an identification of an associated memory location of a last detected error by the memory controller 114, or other suitable information. In certain embodiments, the main processor 112 can also be configured to clear the machine check register 133 once the current error checking data 123 is read.

Figure 2E:
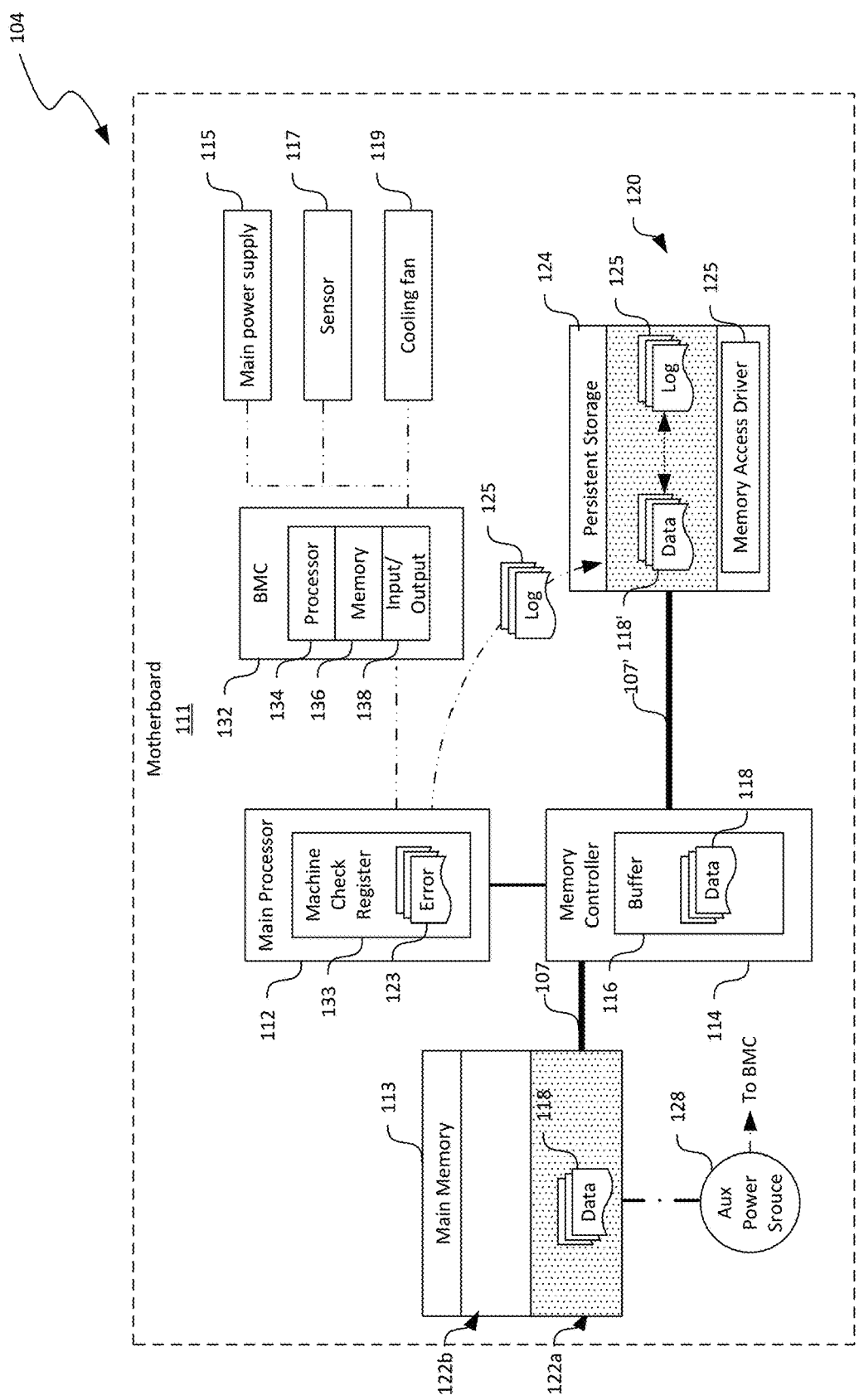

As shown in FIG. 2E, in response to detecting an integrity data error based on the error checking data 123, the main processor 112 can create and/or update a log 125 in the persistent storage 124 indicating the detected integrity data error. In one embodiment, the log 125 can include a single file associated with the data 118' stored in the persistent storage 124. In other embodiments, the log 125 can include an entry in a log file in the persistent storage 124 with the entry identifying a location, size, or other characteristics of the data 118' having the integrity data error (e.g., having two flipped bits, having a detected uncorrectable error, having a detected error that would have been correctable if the error protection bits were available, or the like). In further embodiments, the log 125 may be appended to the data 118' or being associated with the data 118' in other suitable manners. Once persistence of the data 118 is completed, the memory access driver 125 can notify the main processor 112 accordingly. The main processor 112 can then initiate a system shutdown, reset, or other suitable operations.

Several embodiments of the disclosed technology described above with reference to FIGS. 2A-2E can ensure data integrity of persisting the data 118 in the main memory 113 even though the corresponding data 118' in the persistent storage 124 only includes data bits. By scanning the machine check register 133, the main processor 112 can store information regarding data integrity of the persisted data 118' in the persistent storage 124. As such, upon system reset (e.g., reboot of the computing unit 104), the operating system and/or other suitable components of the computing unit 104 can determine whether any errors exist in the data 118'.

Even though the persistence operations are described above via execution of instructions by the main processor 112, in certain embodiments, other processors that do not have access to error correcting bits can also be used. For example, an auxiliary processor (not shown) can be used to execute the corresponding instructions in lieu of or in addition to the main processor 112. In further embodiments, the main processor 112 can be configured to facilitate copying the data 118 from the main memory 113 into the persistent storage 124. The main processor 112 can be configured to perform the data integrity checking and append the log 125 to the data 118' when an error is detected. In yet further embodiments, the BMC, which does not have access to the error correcting bits, can be configured to perform the foregoing operations in lieu of or in addition of the main processor 112.

Figure 3:
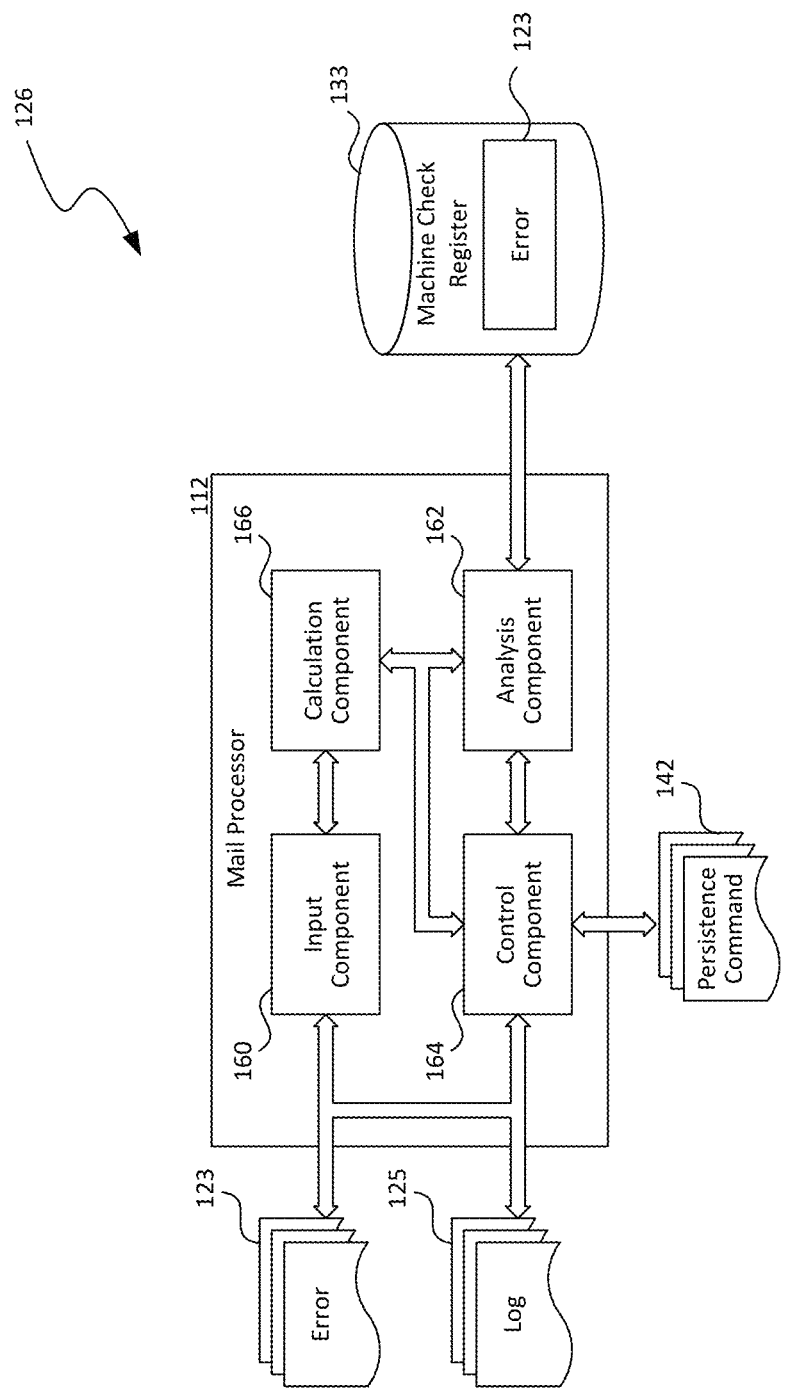
FIG. 3 is a block diagram showing software modules suitable for the main processor of FIGS. 2A-2E in accordance with embodiments of the present technology.

FIG. 3 is a block diagram showing certain computing system components suitable for the main processor 112 in FIGS. 2A-2E in accordance with embodiments of the disclosed technology. In FIG. 3 and in other Figures herein, individual software components, objects, classes, modules, and routines may be a computer program, procedure, or process written as source code in C, C++, C#, Java, and/or other suitable programming languages. A component may include, without limitation, one or more modules, objects, classes, routines, properties, processes, threads, executables, libraries, or other components. Components may be in source or binary form. Components may include aspects of source code before compilation (e.g., classes, properties, procedures, routines), compiled binary units (e.g., libraries, executables), or artifacts instantiated and used at runtime (e.g., objects, processes, threads).

Components within a system may take different forms within the system. As one example, a system comprising a first component, a second component and a third component can, without limitation, encompass a system that has the first component being a property in source code, the second component being a binary compiled library, and the third component being a thread created at runtime. The computer program, procedure, or process may be compiled into object, intermediate, or machine code and presented for execution by one or more processors of a personal computer, a network server, a laptop computer, a smartphone, and/or other suitable computing devices.

Equally, components may include hardware circuitry. A person of ordinary skill in the art would recognize that hardware may be considered fossilized software, and software may be considered liquefied hardware. As one example, software instructions in a component may be burned to a Programmable Logic Array circuit, or may be designed as a hardware circuit with appropriate integrated circuits. Equally, hardware may be emulated by software. Various implementations of source, intermediate, and/or object code and associated data may be stored in a computer memory that includes read-only memory, random-access memory, magnetic disk storage media, optical storage media, flash memory devices, and/or other suitable computer readable storage media excluding propagated signals.

As shown in FIG. 3, the main processor 112 can execute instructions to provide an input component 160, a calculation component 166, a control component 164, and an analysis component 162 interconnected with one another. The input component 160 can be configured to receive error checking data 123 by scanning the machine check register 133 (FIG. 2A). The input component 160 can then provide the received error checking data 123 to the analysis component 162 for further processing.

The calculation component 166 may include routines configured to perform various types of calculations to facilitate operation of other components of the module controller 126. For example, the calculation component 166 can include routines for accumulating a count of errors detected based on the error checking data 123. In other examples, the calculation component 166 can include linear regression, polynomial regression, interpolation, extrapolation, and/or other suitable subroutines. In further examples, the calculation component 166 can also include counters, timers, and/or other suitable routines.

The analysis component 162 can be configured to analyze the error checking data 123 to determine whether certain data (or blocks thereof) copied from the main memory 113 (FIG. 2A) includes errors impacting integrity of the copied data 118 (FIG. 2A). In certain embodiments, the errors can include non-correctable errors such as two flipped bits when using a dual-error detecting code. In other embodiments, the errors can include correctable errors such as single flipped bit when using a single-error correcting code. The analysis component 162 can then indicate the existence of errors according results of analysis.

The control component 164 can be configured to control creation/update of the log 125 indicating errors in data integrity according to the analysis results from the analysis component 162. In certain embodiments, the control component 164 can store the log 125 in the persistent storage 124 (FIG. 2A). In other embodiments, the control component 164 can also be configured to issue the persistence command 142 in response to a detected power failure of the main power supply 115, or a shutdown request from a user. Additional functions of the various components of the main processor 112 are described in more detail below with reference to FIGS. 4-6.

Figure 4:
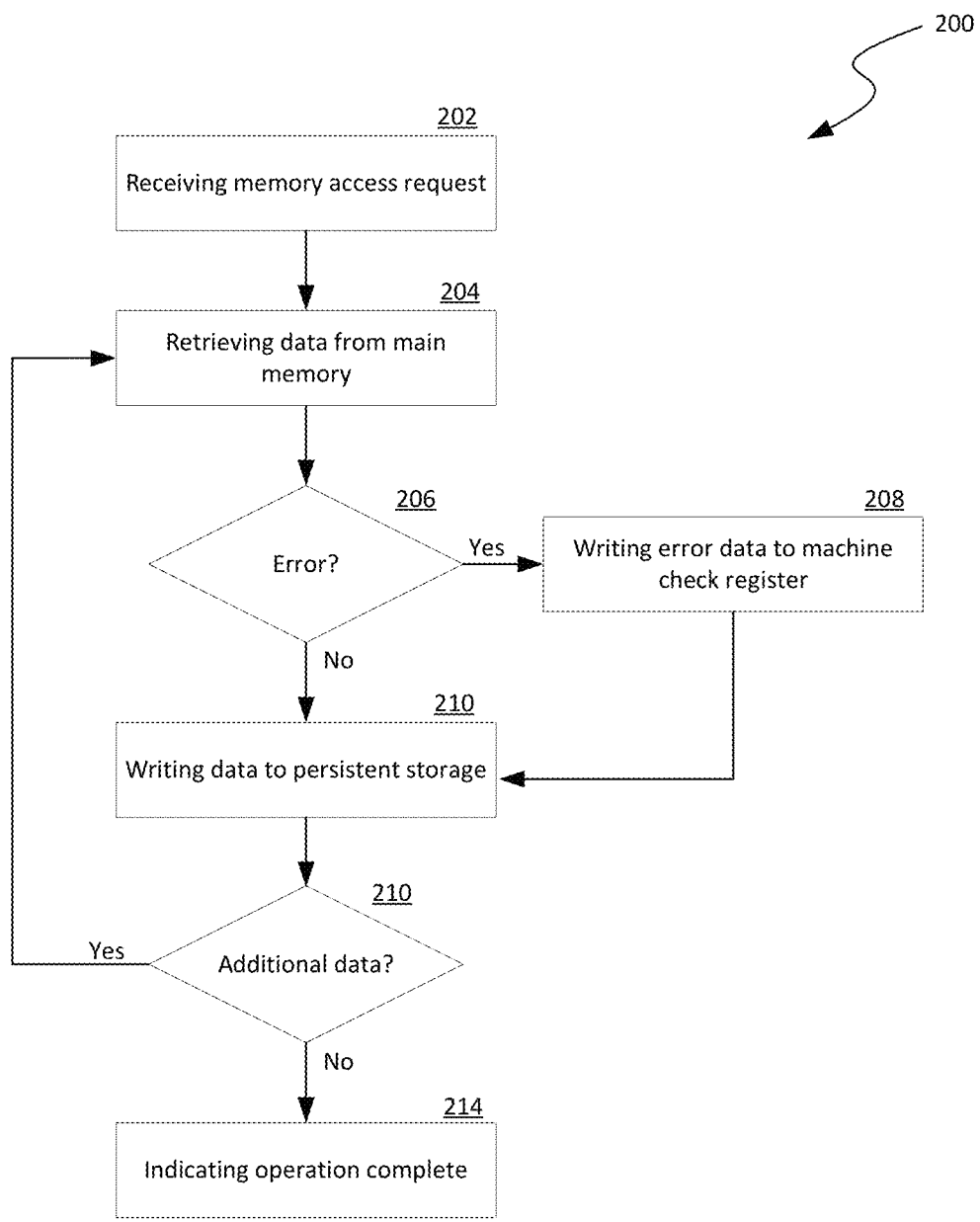
FIGS. 4-6 are flow diagrams illustrating various aspects of processes for ensuring data integrity during backup operations in accordance with embodiments of the present technology.

FIG. 4 is a flow diagram illustrating a process 200 for ensuring data integrity during data backup in accordance with embodiments of the present technology. Even though the process 200 and other processes are described below with reference to the computing system 100 in FIG. 1 and the computing unit 104 in FIGS. 2A-2E, several embodiments of the process 200 may also be used in other computer systems or devices.

As shown in FIG. 4, the process 200 can include receiving a memory access request to copy data from certain memory locations of a main memory 113 (FIG. 2A) at stage 202. In one embodiment, the memory access request can be received from a memory access driver 125 (FIG. 2A) of the persistent storage 124 (FIG. 2A). In other embodiments, the memory access request can be received from the main processor 112 (FIG. 2A) or other suitable components on the motherboard 111 (FIG. 2A).

The process 200 can then include retrieving data from the main memory 113 and store the retrieved data in a buffer 116 (FIG. 2A) at stage 204. In certain embodiments, the retrieved data can include data bits and corresponding EDC/ECC bits. In other embodiments, the retrieved data can also include parity bits, check sum bits, or other suitable bits. The process 200 can then include a decision stage 206 to determine whether the retrieved data has data integrity errors based on the EDC/ECC bits or other suitable bits included with the data bits. In response to determining that the retrieved data has data integrity errors, the process 200 can include writing error checking data into a memory location accessible by the main processor 112. In the example shown in FIGS. 2A-2E, the memory location includes a machine check register 133. In other embodiments, the memory location can include a memory block in the main memory 113, a designated cache, or other suitable locations. The process 200 can then proceed to writing the data bits of the retrieved data without the EDC/ECC bits to the persistent storage 124 at stage 210.

In response to determining that the retrieved data does not have data integrity errors, in the illustrated embodiment, the process 200 proceeds directly to writing the data bits of the retrieved data without the EDC/ECC bits to the persistent storage 124 at stage 210. In other embodiments, the process 200 can optionally include writing additional data to the memory location accessible by the main processor 112 indicating that the retrieved data does not include data integrity errors.

The process 200 can then include another decision stage 210 to determine whether additional data is to be copied from the main memory 113. In response to determining additional data is to be copied from the main memory 113, the process 200 can revert to retrieving additional data from the main memory at stage 204. In response to determining no additional data is to be copied from the main memory 113, the process 200 proceeds to indicating that the data copying operation is completed to, for example, the main processor 112, at stage 214.

Figure 5:
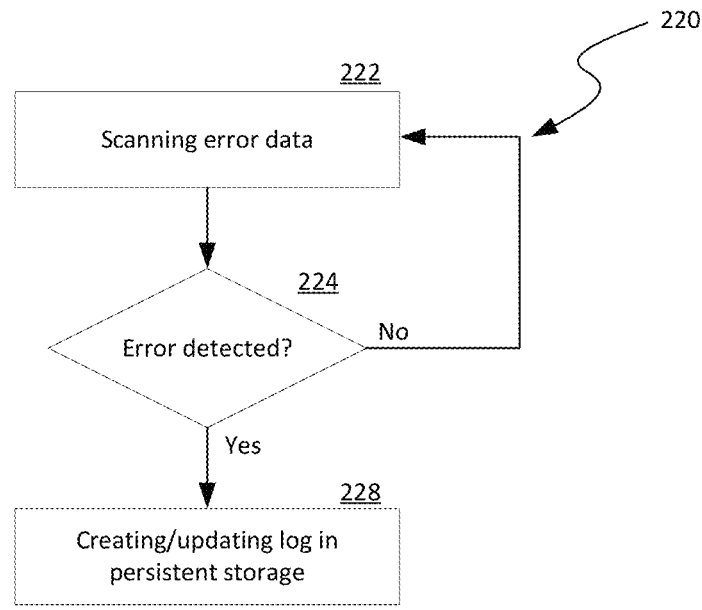

FIG. 5 is a flow diagram illustrating a process 220 for ensuring data integrity during data backup in accordance with embodiments of the present technology. As shown in FIG. 5, the process 220 can include scanning a memory location for error checking data related to data integrity at stage 222. In certain embodiments, the memory location can include a machine check register 133 (FIG. 2A) on the main processor 112 (FIG. 2A). In other embodiments, the memory location can include other suitable storage location.

The process 220 can then include a decision stage 224 to determine whether the copied data has uncorrectable errors such as two flipped bits or other suitable data integrity errors in an error correcting block. In one embodiment, the scanned error checking data can include a flag (e.g., a binary number) in a data field indicating the existence of a data integrity error or the lack thereof. For example, an error bit can be set to indicate existence of an error. If the bit is set after a data copy operation, the process 220 can include determining a location of the indicated error by performing clearing the error bit, for example, by the main processor 112 in FIG. 2A and performing copying a subset of the data coped during the data copy operation. The operations can also include a binary search, reading on EDC/ECC block boundaries as smallest unit. Optionally, larger data ranges, such as 4 k, a physical memory page size, or other suitable data ranges can also be used as the smallest unit for performing the error checking.

In another embodiment, the scanned error checking data can include a counter having a value representing an accumulated count of errors. In certain implementations, a maximum error number storable in a machine check register can be used to limit the number of EDC/ECC blocks read before checking the counter value. For example, the number of EDC/ECC blocks read may be limited to prevent the counter from looping back to its original value in a single operation. Thus, if the error counter can store 65,536 distinct values, up to 65,535 potential errors may be detected without causing the counter value to return to its original value. Thus, using the 64+8 bits of SEC-DED as an example EDC/ECC block, implementations may check the error counter value after reading each (65535*64 bits) of data. Thus, determining whether the copied data has uncorrectable errors or other suitable data integrity errors can include the following operations:

reading the machine check register to obtain a first value of the counter (old value);

after the data is copied, reading the machine check register to obtain a second value of the counter (new value);

if the old value (i.e., the first value) does not equal the new value (i.e., the second value), indicating that at least one error occurred during the data copying operation. The process can then include optionally determining the location of the error(s) by performing the following, such as iteratively or recursively:

determining a third value of the counter (either reading the register again, or using the previous old value) (old value);

after a subset of data is copied, reading the machine check register to obtain a fourth value of the counter (new value).

if the old value (third value) does not equal the new value (fourth value), indicating that at least one error occurred during the data copying operation for the subset.

Optionally, larger data ranges, such as 4 k, a physical memory page size, or other suitable data ranges can also be used as the smallest unit for performing the error checking. In a further embodiment, the error checking data can include data representing an address range that correspond to an EDC/ECC block size or multiples thereof. If the error checking data indicates existence of a most recent error, then by inference, all later-read EDC/ECC blocks are free of such errors. Thus, the process 220 can log the error and/or the address range, and can optionally include determining additional locations of errors by repeating the operation on the subset of data that excludes the EDC/ECC block having the error and those that followed.

In a further embodiment, the error checking data can include data representing an address range that corresponds to an EDC/ECC block size or multiples thereof. If the error checking data indicates existence of a most recent error and the data copying operation is stopped in response to a detected error, then by inference, all copied EDC/ECC blocks except those in the address range specified in the error checking data were free of such errors. Thus, the process 220 can include continuing the data copying operation by logging the error and/or address range, and continuing the process with the EDC/ECC block immediately following the ones specified in the address range. In other embodiments, the error checking data can include other suitable indications of the existence of a data integrity error or the lack thereof.

In response to determining that a data integrity error exists, the process 220 can proceed to creating/updating a log file in a persistent storage 124 (FIG. 2A) containing information of the detected data integrity error. For example, the log file can include entries each identifying a type of error, a range of memory in which the error occurred, or other suitable information. In response to determining that a data integrity error does not exist, in the illustrated embodiment, the process 220 reverts to scanning error checking data at stage 222. In other embodiments, the process 220 can also optionally include creating/updating the log file in the persistent storage 124 indicating a lack of detected data integrity error.

Figure 6:
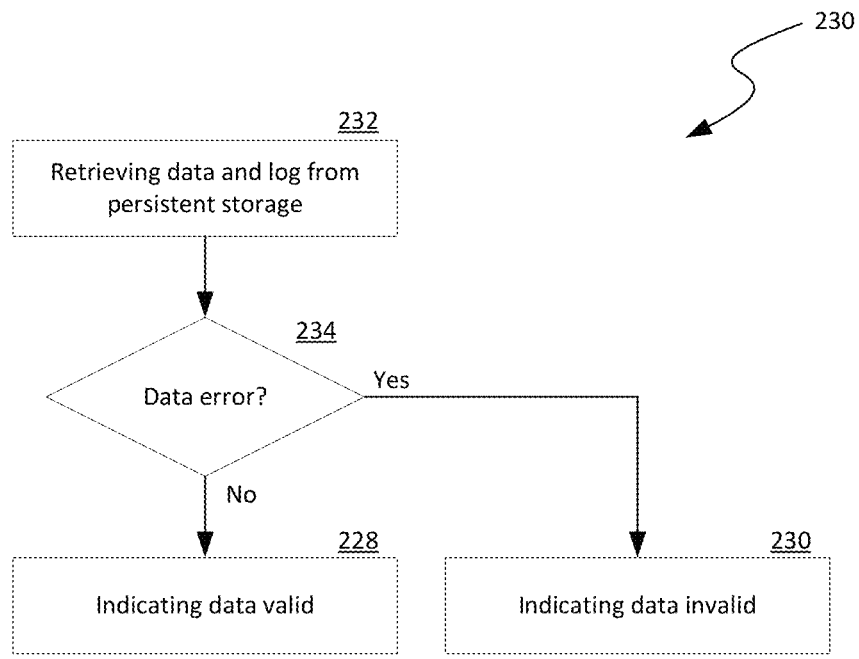

FIG. 6 is a flow diagram illustrating a process 230 for ensuring data integrity during data backup in accordance with embodiments of the present technology. As shown in FIG. 6, the process 230 can include retrieving data and associated log file from a persistent storage 124 (FIG. 2A) at stage 232. The log file can contain data written by the processor and indicating whether blocks, pages, or other segments of the retrieved data has data integrity errors as well as a size of data block protected by error correcting bits. The process 230 can then include a decision stage 234 to determine whether such data errors exist in the retrieved data based on information included in the retrieved log file. In response to determining that one or more data errors exist, the process 230 can include indicating to, for example, an operating system, that the retrieved data is invalid. In certain implementations, the process 230 can use existing mechanisms that indicate uncorrectable memory errors exist, such as SMM handler functions. In response to determining that one or more data errors do not exist, the process 230 can include indicating to, for example, the operating system, that the retrieved data is valid.

Figure 7:
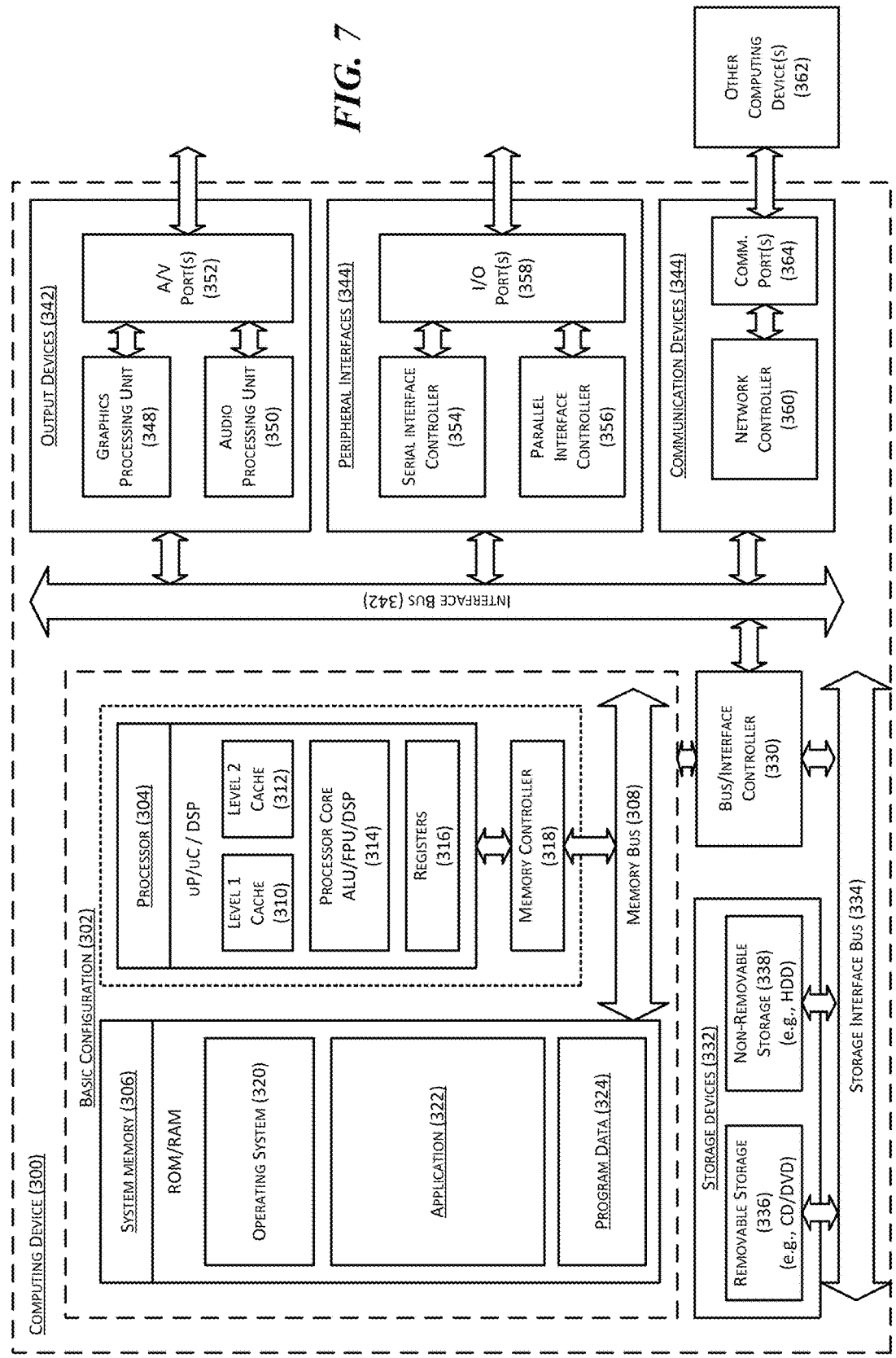
FIG. 7 is a computing device suitable for certain components of the computing system in FIG. 1.

FIG. 7 is a computing device 300 suitable for certain components of the computing system 100 in FIG. 1, for example, the computing unit 104 or the client device 103. In a very basic configuration 302, the computing device 300 can include one or more processors 304 and a system memory 306. A memory bus 308 can be used for communicating between processor 304 and system memory 306. Depending on the desired configuration, the processor 304 can be of any type including but not limited to a microprocessor (µP), a microcontroller (µC), a digital signal processor (DSP), or any combination thereof. The processor 304 can include one more levels of caching, such as a level-one cache 310 and a level-two cache 312, a processor core 314, and registers 316. An example processor core 314 can include an arithmetic logic unit (ALU), a floating point unit (FPU), a digital signal processing core (DSP Core), or any combination thereof. An example memory controller 318 can also be used with processor 304, or in some implementations memory controller 318 can be an internal part of processor 304.

Depending on the desired configuration, the system memory 306 can be of any type including but not limited to volatile memory (such as RAM), non-volatile memory (such as ROM, flash memory, etc.) or any combination thereof. The system memory 306 can include an operating system 320, one or more applications 322, and program data 324. This described basic configuration 302 is illustrated in FIG. 7 by those components within the inner dashed line.

The computing device 300 can have additional features or functionality, and additional interfaces to facilitate communications between basic configuration 302 and any other devices and interfaces. For example, a bus/interface controller 330 can be used to facilitate communications between the basic configuration 302 and one or more data storage devices 332 via a storage interface bus 334. The data storage devices 332 can be removable storage devices 336, non-removable storage devices 338, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data. The term "computer readable storage media" or "computer readable storage device" excludes propagated signals and communication media.

The system memory 306, removable storage devices 336, and non-removable storage devices 338 are examples of computer readable storage media. Computer readable storage media include, but not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information and which can be accessed by computing device 300. Any such computer readable storage media can be a part of computing device 300. The term "computer readable storage medium" excludes propagated signals and communication media.

The computing device 300 can also include an interface bus 340 for facilitating communication from various interface devices (e.g., output devices 342, peripheral interfaces 344, and communication devices 346) to the basic configuration 302 via bus/interface controller 330. Example output devices 342 include a graphics processing unit 348 and an audio processing unit 350, which can be configured to communicate to various external devices such as a display or speakers via one or more A/V ports 352. Example peripheral interfaces 344 include a serial interface controller 354 or a parallel interface controller 356, which can be configured to communicate with external devices such as input devices (e.g., keyboard, mouse, pen, voice input device, touch input device, etc.) or other peripheral devices (e.g., printer, scanner, etc.) via one or more I/O ports 358. An example communication device 346 includes a network controller 360, which can be arranged to facilitate communications with one or more other computing devices 362 over a network communication link via one or more communication ports 364.

The network communication link can be one example of a communication media. Communication media can typically be embodied by computer readable instructions, data structures, program modules, or other data in a modulated data signal, such as a carrier wave or other transport mechanism, and can include any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), microwave, infrared (IR) and other wireless media. The term computer readable media as used herein can include both storage media and communication media.

The computing device 300 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. The computing device 300 can also be implemented as a personal computer including both laptop computer and non-laptop computer configurations.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A computing device having a processor with a machine check register, a memory, a memory controller, and a persistent storage interconnected to one another, the memory containing instructions executable by the processor to cause the computing device to:

retrieve, with the memory controller, data from the memory, the retrieved data containing data bits to be persisted in the persistent storage and error correcting bits corresponding to the data bits;

determine, at the memory controller, whether the retrieved data bits contain one or more data integrity errors based on the error correcting bits corresponding to the data bits; and in response to determining that the retrieved data bits contain one or more data integrity errors, with the memory controller, write data representing existence of the one or more data integrity errors into the machine check register accessible by the processor when execution of an operating system by the processor on the computing device is suspended.

2. The computing device of claim 1 wherein the memory contains additional instructions executable by the processor to cause the computing device to:

copy only the data bits of the retrieved data to the persistent storage; and persist the data representing existence of the one or more data integrity errors in the persistent storage indicating the existence of the one or more integrity errors.

3. The computing device of claim 1 wherein:

to determine whether the accessed data indicates that the data being copied include one or more data integrity errors includes to determine whether the accessed data indicates that the data being copied include one or more two flipped bits; and the data representing existence of the one or more data integrity errors includes data indicating the existence of two flipped bits in the data copied to the persistent storage from the memory.

4. The computing device of claim 1 wherein the memory contains additional instructions executable by the processor to cause the computing device to update an entry in a file in the persistent storage according to the data representing existence of the one or more data integrity errors written into the machine check register, the entry indicating the existence of the one or more data integrity errors in the data copied to the persistent storage from the memory.

5. The computing device of claim 1 wherein the memory contains additional instructions executable by the processor to cause the computing device to create a file in the persistent storage, the created file including data indicating the existence of the one or more data integrity errors in the data copied to the persistent storage from the memory.

6. The computing device of claim 1 wherein the memory contains additional instructions executable by the processor to cause the computing device to execute instructions to access the machine check register periodically while the operating system of the computing device is suspended, the executed instructions being a part of a software package independent of the operating system of the computing device.

7. The computing device of claim 1 wherein the machine check register includes a set of model-specific registers in a processor cache of the processor.

8. The computing device of claim 1 wherein the memory contains additional instructions executable by the processor to cause the computing device to:

detect a power failure of a main power supply associated with the processor or a request for a system shutdown; and in response to the detected power failure or request for a system shutdown, transmit a persistence command to the persistent storage, the persistence command instructing the persistent storage to copy data from a portion of the memory designated as a software implemented non-volatile dual in-line memory module using power from an auxiliary power source.

9. The computing device of claim 1 the memory contains additional instructions executable by the processor to cause the computing device to:
detect a power failure of a main power supply associated with the processor or a request for a system shutdown;
in response to the detected power failure of the main power supply or the request for a system shutdown,
transmit a persistence command to the persistent storage, the persistence command instructing the persistent storage to copy data from the main memory using power from an auxiliary power source;
receive an indication from the persistent storage that data persistence is completed; and
in response to receiving the indication, allow the computing device to shut down.

10. The computing device of claim 1 wherein the one or more data integrity errors are second one or more data integrity errors, and wherein the memory contains additional instructions executable by the processor to cause the computing device to:
retrieve, with the memory controller, additional data from the memory, the retrieved additional data containing data bits and error correcting bits corresponding to the data bits;
determine, at the memory controller, whether the retrieved data bits contain one or more first data integrity errors based on the error correcting bits corresponding to the data bits; and
in response to determining that the retrieved data bits contain one or more first data integrity errors,
suspend the operating system in the computing device; and
persist the data in the memory by performing the to retrieve, to determine, and to write operations.

11. A method for ensuring data integrity in a computing device having a main processor with a processor cache, a memory controller, a volatile memory, and a persistent storage operatively interconnected to one another, the method comprising:
retrieving, with the memory controller, data from the memory, the retrieved data containing data bits to be persisted in the persistent storage and error correcting bits corresponding to the data bits;
determining, at the memory controller, whether the retrieved data bits contain one or more data integrity errors based on the error correcting bits corresponding to the data bits; and
in response to determining that the retrieved data bits contain one or more data integrity errors, with the memory controller, writing data representing existence of the one or more data integrity errors into the machine check register accessible by the processor when execution of an operating system by the processor on the computing device is suspended.

12. The method of claim 11, further comprising:
copying only the data bits of the retrieved data to the persistent storage; and
persisting the data representing existence of the one or more data integrity errors in the persistent storage indicating the existence of the one or more integrity errors.

13. The method of claim 11 wherein:
determining whether the accessed data indicates that the data being copied include one or more data integrity errors includes determining whether the accessed data indicates that the data being copied include one or more two flipped bits; and
the data representing existence of the one or more data integrity errors includes data indicating the existence of two flipped bits in the data copied to the persistent storage from the memory.

14. The method of claim 11, further comprising updating an entry in a file in the persistent storage according to the data representing existence of the one or more data integrity errors written into the machine check register, the entry indicating the existence of the one or more data integrity errors in the data copied to the persistent storage from the memory.

15. The method of claim 11, further comprising creating a file in the persistent storage, the created file including data indicating the existence of the one or more data integrity errors in the data copied to the persistent storage from the memory.

16. The method of claim 11, further comprising executing instructions to access the machine check register periodically while the operating system of the computing device is suspended, the executed instructions being a part of a software package independent of the operating system of the computing device.

17. The method of claim 11 wherein the machine check register includes a set of model-specific registers in a processor cache of the processor.

18. The method of claim 11, further comprising:
detecting a power failure of a main power supply associated with the processor or a request for a system shutdown; and
in response to the detected power failure or request for a system shutdown, transmitting a persistence command to the persistent storage, the persistence command instructing the persistent storage to copy data from a portion of the memory designated as a software implemented non-volatile dual in-line memory module using power from an auxiliary power source.

19. The method of claim 11, further comprising:
detecting a power failure of a main power supply associated with the processor or a request for a system shutdown;
in response to the detected power failure of the main power supply or the request for a system shutdown,
transmitting a persistence command to the persistent storage, the persistence command instructing the persistent storage to copy data from the main memory using power from an auxiliary power source;
receiving an indication from the persistent storage that data persistence is completed; and
in response to receiving the indication, allowing the computing device to shut down.

20. The method of claim 11 wherein the one or more data integrity errors are second one or more data integrity errors, and wherein the method further includes:
retrieving, with the memory controller, additional data from the memory, the retrieved additional data containing data bits and error correcting bits corresponding to the data bits;
determining, at the memory controller, whether the retrieved data bits contain one or more first data integrity errors based on the error correcting bits corresponding to the data bits; and
in response to determining that the retrieved data bits contain one or more first data integrity errors, suspending the operating system in the computing device; and persisting the data in the memory by performing the to retrieve, to determine, and to write operations.

* * * * *